United States Patent
Kwon et al.

(10) Patent No.: US 9,190,426 B2
(45) Date of Patent: Nov. 17, 2015

(54) DISPLAY DEVICE AND METHOD OF MANUFACTURING THE SAME

(71) Applicant: Samsung Display Co., Ltd., Yongin (KR)

(72) Inventors: Do-Hyun Kwon, Yongin (KR); Il-Jeong Lee, Yongin (KR); Min-Jung Lee, Yongin (KR); Sung-Eun Lee, Yongin (KR); Jung-Kyu Lee, Yongin (KR); Kwang-Young Choi, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/103,354

(22) Filed: Dec. 11, 2013

(65) Prior Publication Data
US 2015/0001487 A1    Jan. 1, 2015

(30) Foreign Application Priority Data

Jul. 1, 2013 (KR) .................. 10-2013-0076621

(51) Int. Cl.
| | | |
|---|---|---|
| H01L 29/04 | (2006.01) | |
| H01L 31/036 | (2006.01) | |
| H01L 27/12 | (2006.01) | |
| H01L 27/32 | (2006.01) | |
| H01L 51/52 | (2006.01) | |

(52) U.S. Cl.
CPC ........ *H01L 27/1259* (2013.01); *H01L 27/1248* (2013.01); *H01L 27/3258* (2013.01); *H01L 51/5246* (2013.01)

(58) Field of Classification Search
CPC . H01L 27/32; H01L 27/3225; H01L 27/3251; H01L 27/3258; H01L 51/50; H01L 51/525; H01L 2227/32
See application file for complete search history.

(56) References Cited

U.S. PATENT DOCUMENTS

| | | | | |
|---|---|---|---|---|
| 2005/0067953 | A1* | 3/2005 | Yamazaki et al. ............ | 313/506 |
| 2007/0262391 | A1* | 11/2007 | Jin ................................ | 257/369 |
| 2011/0193070 | A1* | 8/2011 | Yamazaki et al. .............. | 257/40 |

FOREIGN PATENT DOCUMENTS

| | | |
|---|---|---|
| KR | 10-0728129 | 6/2007 |
| KR | 10-0782461 | 12/2007 |

OTHER PUBLICATIONS

Choi Chi Gyu, "Visit to the Laboratory, Nano Thin Film Material Research Laboratory, Jeju University," Physics & High Technology, The Korean Physical Society, vol. 17, No. 12, pp. 41-42, Dec. 2008.

* cited by examiner

*Primary Examiner* — Hoai V Pham
(74) *Attorney, Agent, or Firm* — H.C. Park & Associates, PLC

(57) ABSTRACT

A display device includes a substrate, an active layer, a gate insulation layer, a gate electrode, an interlayer insulation layer, a clad layer, a source electrode, and a drain electrode. The active layer is disposed on the substrate. The gate insulation layer is disposed on the active layer. The gate electrode is disposed on the gate insulation layer. The interlayer insulation layer is disposed on the gate electrode. A dielectric constant of the interlayer insulation layer is less than a dielectric constant of the gate insulation layer. The clad layer is disposed on the interlayer insulation layer. The source and drain electrodes are disposed on the clad layer.

13 Claims, 4 Drawing Sheets

DISPLAY DEVICE AND METHOD OF MANUFACTURING THE SAME

CROSS-REFERENCE TO RELATED APPLICATION

This application claims priority from and the benefit of Korean Patent Application No. 10-2013-0076621, filed on Jul. 1, 2013, which is incorporated by reference for all purposes as if set forth herein.

BACKGROUND

1. Field

Exemplary embodiments relate to display devices, and, more particularly, to display devices including an interlayer insulation layer including a low dielectric constant material and a method of manufacturing the same.

2. Discussion

Conventional organic light emitting diode (OLED) displays are a type of self-emissive display technology, and, as such, may be relatively thin and lightweight as an additional light source is not necessary. Further, these OLED displays may exhibit relatively high-quality characteristics, such as, low power consumption, high luminance, and fast response speed.

Traditional OLED displays typically include an active layer, a gate insulation layer, gate wires including a gate electrode and a gate line, an interlayer insulation layer, and data wires including source and data electrodes and a data line. The interlayer insulation layer may be formed using a low dielectric constant material to minimize (or otherwise reduce) parasitic capacitance, which may occur in association with a portion of the interlayer insulation layer where at least one of the gate wires and at least one of the data wires intersect. Such interlayer insulation layers, however, may have less acid resistance as compared to silicon oxide or silicon nitride included in the gate insulation layer. Further, a surface of the interlayer insulation layer may become non-uniform when a cleaning solution, such as hydrogen fluoride (HF), is used to clean a surface of the interlayer insulation layer. To this end, defects may be caused, at least in part, by the non-uniformity of the surface of the interlayer insulation layer in a portion of the source and data electrodes disposed on the non-uniform surface of the interlayer insulation layer. As such, the data wire including the data line may be lost.

The above information disclosed in this Background section is only for enhancement of understanding of the inventive concept, and, therefore, it may contain information that does not form the prior art that is already known in this country to a person of ordinary skill in the art.

SUMMARY

Exemplary embodiments provide a display device including a low dielectric constant interlayer insulation layer that minimizes (or at least reduces) damage or defects to the low dielectric constant interlayer insulation layer that may otherwise occur in association with the utilization of a cleaning solution on a surface of the interlayer insulation layer.

Exemplary embodiments provide a method of manufacturing the display device.

Additional aspects will be set forth in the detailed description which follows and, in part, will be apparent from the disclosure, or may be learned by practice of the inventive concept.

According to exemplary embodiments, a display device includes: a substrate; an active layer disposed on the substrate; a gate insulation layer disposed on the active layer; a gate electrode disposed on the gate insulation layer; an interlayer insulation layer disposed on the gate electrode, a dielectric constant of the interlayer insulation layer being less than a dielectric constant of the gate insulation layer; a clad layer disposed on the interlayer insulation layer; a source electrode disposed on the clad layer; and a drain electrode disposed on the clad layer.

According to exemplary embodiments, a method includes: forming an active layer on a substrate; forming a gate insulation layer on the active layer; forming a gate electrode on the gate insulation layer; forming an interlayer insulation layer on the gate insulation layer, the interlayer insulation layer being formed covering the gate electrode; forming a clad layer on the interlayer insulation layer; and forming an electrode on the clad layer. A dielectric constant of the interlayer insulation layer is smaller than a dielectric constant of the gate insulation layer.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept and are incorporated in and constitute a part of this specification, illustrate exemplary embodiments of the inventive concept, and together with the description serve to explain the principles of the inventive concept.

DETAILED DESCRIPTION OF THE ILLUSTRATED EMBODIMENTS

Figure 1:
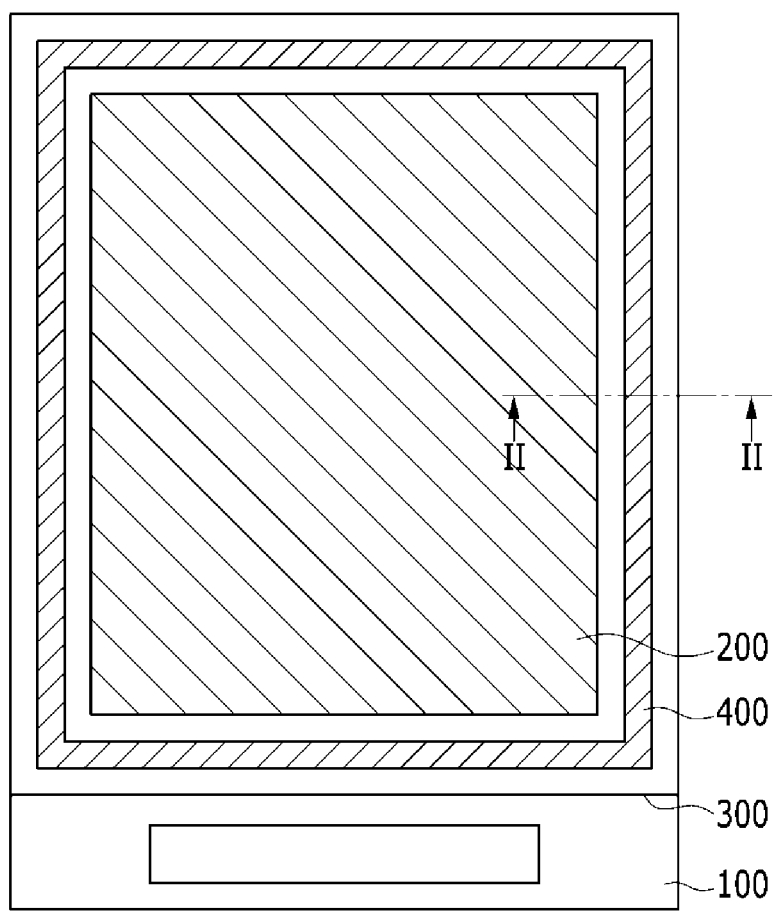
FIG. 1 is a plan view of a display device, according to exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Although exemplary embodiments are described with respect to organic light emitting diode (OLED) displays, it is contemplated that various exemplary embodiments are also applicable to other display technologies, such as, for instance, liquid crystal displays (LCDs), plasma displays (PDs), field emission displays (FEDs), electrophoretic displays (EPDs), electrowetting displays (EWDs), and the like.

Figure 2:
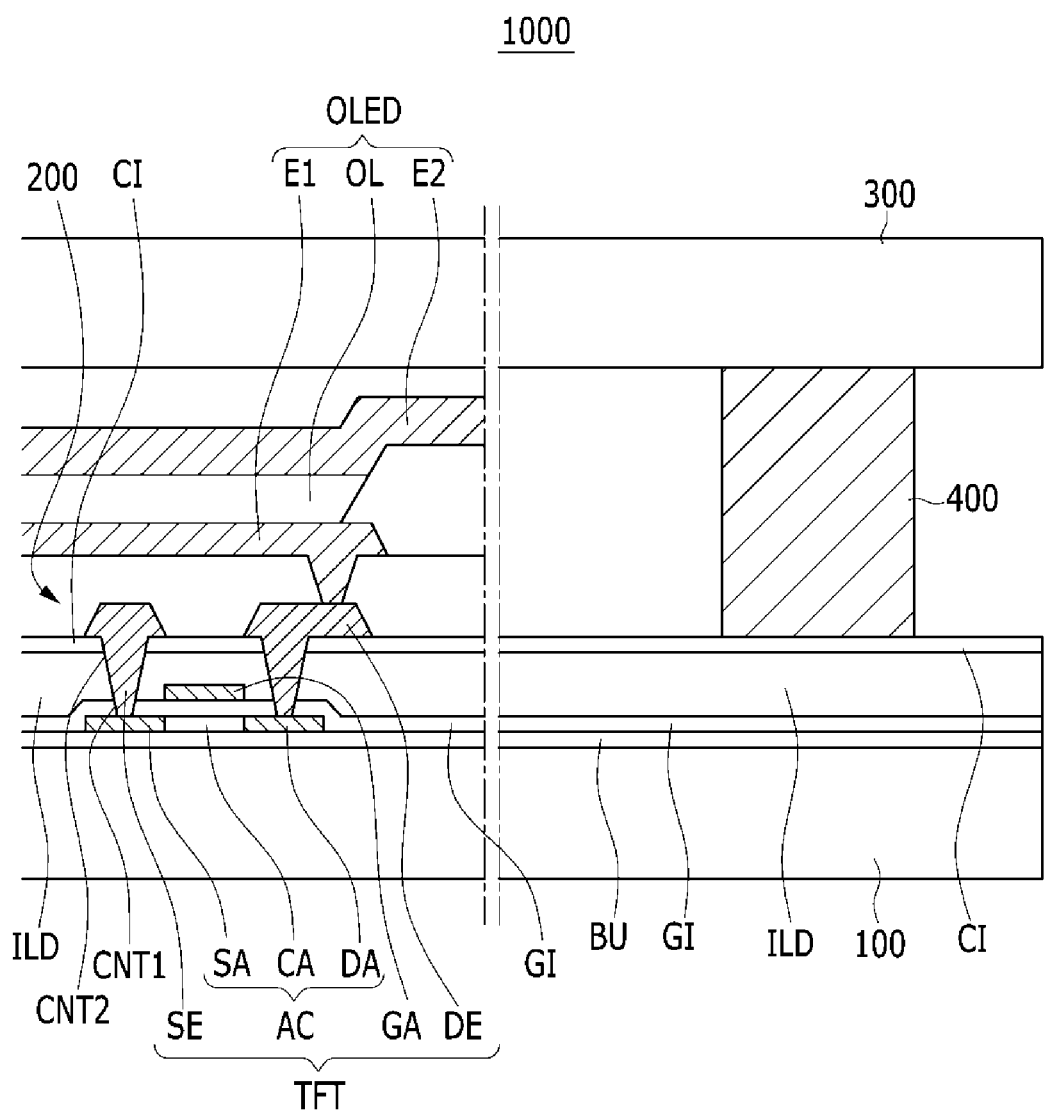
FIG. 2 is a cross-sectional view of the display device of FIG. 1 taken along sectional line II-II, according to exemplary embodiments.

FIG. 1 is a display device, according to exemplary embodiments. FIG. 2 is a cross-sectional view of the display device of FIG. 1 taken along sectional line II-II.

As shown in FIG. 1, the display device 1000 includes a first substrate (e.g., an insulation substrate) 100, a display 200, a second substrate (e.g., an encapsulation substrate) 300, and a sealant 400. Although specific reference will be made to this particular implementation, it is also contemplated that display device 1000 may embody many forms and include multiple and/or alternative components. For example, it is contemplated that the components of display device 1000 may be combined, located in separate structures, and/or separate locations.

According to exemplary embodiments, the first substrate 100 may be formed from any suitable transparent, insulating material, such as, for example, glass, quartz, ceramic, plastic, etc. It is contemplated, however, that any other suitable material may be utilized, such as, for instance, a metal substrate material, e.g., stainless steel. When the first substrate 100 is made a plastic material, the display device 1000 may be flexible, stretchable, and/or rollable.

The display 200 may be configured to display an image, and may be disposed on the first substrate 100. In this manner, the display may be disposed between the first substrate 100 and the second substrate 300. Further, the sealant 400, together with the first substrate 100 and the second substrate 300, may seal the display in a region disposed therebetween.

In exemplary embodiments, the second substrate 300 may be formed from any suitable transparent, insulating material, such as, for instance, one or more of the aforementioned materials utilized in association with the first substrate 100. At least one of the second substrate 300 and the first substrate 100 may be made of a light transmitting material. As previously mentioned, the second substrate 300 and the first substrate 100 may be assembled and sealed to each other using the sealant 400. In this manner, the display 200 may be sealed therebetween with the second substrate 300 and the first substrate 100 serving to protect the display 200 from external interferences, e.g., dust, debris, moisture, etc.

As shown in FIG. 2, the display 200 may include a buffer layer BU, an active layer AC, a gate insulation layer GI, a gate electrode GA, an interlayer insulation layer ILD, a clad layer CI, a source electrode SE, a drain electrode DE, and an organic light emitting diode OLED.

The buffer layer BU may be disposed on the first substrate 100. The buffer layer BU may be further disposed between the first substrate 100 and the active layer AC. In exemplary embodiments, the buffer layer BU may be a single-layered or a multi-layered insulation layer, including, for example, silicon nitride, silicon oxide, etc. The buffer layer BU may be formed on a first (e.g., frontal) surface of the first substrate 100.

The active (or semiconductor) layer AC may be disposed on the buffer layer BU, and may include amorphous silicon, polysilicon, and the like. The active layer AC may include a source area SA, a drain area DA, and a channel area CA. The source area SA may be doped with one or more impurities. The channel area CA may be disposed between the source area SA and the drain area DA. The source area SA and the drain area DA may be respectively exposed by a first contact hole (or via) CNT1 form in the gate insulation layer GI, a second contact hole (or via) CNT2 formed in the interlayer insulation layer ILD, and a hole (or via) formed in the clad layer CI.

In exemplary embodiments, the gate insulation layer GI may be disposed on the active layer AC, and may cover the active layer AC. The gate insulation layer GI may be a single-layered or multi-layered insulation layer, including, for example, silicon nitride, silicon oxide, etc. The gate insulation layer GI may include the first contact hole CNT1 to expose the source area SA and the drain area DA portions of the active layer AC. The gate insulation layer GI may be formed on the first surface of the first substrate 100.

According to exemplary embodiments, the gate electrode GA may be sized in correspondence with the channel area CA of the active layer AC, and may be disposed on the gate insulation layer GI. A gate wire, such as a gate line connected to the gate electrode GA, may be disposed at the same layer as the gate electrode GA. The gate wire may include any suitable structure and may be formed from any suitable material.

In exemplary embodiments, the interlayer insulation layer ILD may be disposed on and cover the gate electrode GA. The interlayer insulation layer ILD may include a second contact hole CNT2 communicating with the first contact hole CNT1 of the gate insulation layer GI. The source area SA and the drain area DA of the active layer AC may be exposed by the first contact hole CNT1 and the second contact hole CNT2. To this end, the first contact hole CNT1 and the second hole CNT2 may be concentrically aligned with one another. Further, the interlayer insulation layer ILD may include any suitable material with a low dielectric constant as compared to the gate insulation layer GI. For example, the interlayer insulation layer ILD may include a material with a dielectric constant of 2.5 to 3.5. In exemplary embodiments, the interlayer insulation layer ILD may be formed from, for instance, at least one of silicon oxycarbide (SiOC) and silicon oxyfluoride (SiOF). To this end, the interlayer insulation layer ILD may be formed on the first surface of the first substrate 100.

As seen in FIG. 2, the clad layer CI may be disposed on the interlayer insulation layer ILD and may cover the interlayer insulation layer ILD. The clad layer (CI) may be a single-layered or multi-layered insulation layer, including, for example, silicon nitride, silicon oxide, etc. The clad layer CI may include a hole communicating with the second contact hole CNT2, which is in communication with the first contact hole CNT1. In this manner, the hole formed in the clad layer CI may be concentrically aligned with at least one of the first contact hole CNT1 and the second contact hole CNT2. Further, the clad layer (CI) may be disposed on the first surface of the first substrate 100.

According to exemplary embodiments, the source electrode SE and the drain electrode DE may be disposed on the clad layer CI. The source electrode SE and the drain electrode DE may respectively contact the source area SA and the drain area DA of the active layer AC, and, as such, may be respectively connected to source area SA and the drain area DA via the hole form in the clad layer CI, the second contact hole CNT2 formed in the interlayer insulation layer ILD, and the first contact hole CNT1 formed in the gate insulation layer GI. The data wire including the source electrode SE, the drain electrode DE, the data line, and a drive power supply line (not shown) may be disposed on the same layer as the source electrode SE and the drain electrode DE. In this manner, the data wire may include any suitable structure. The source electrode SE, the drain electrode DE, the gate electrode GA, and the active layer AC may form a switching element, e.g., thin film transistor TFT.

The organic light emitting diode OLED may be connected to the drain electrode DE, and may receive a driving signal from the thin film transistor TFT to emit light. The organic light emitting diode OLED may include a first electrode E1, an organic emission layer OL, and a second electrode E2.

According to exemplary embodiments, the first electrode E1 may be an anode configured as a hole injection electrode, and the second electrode E2 may be a cathode configured as an electron injection electrode. It is contemplated, however, that the first electrode E1 may be the cathode and the second electrode E2 may be the anode. Holes and electrons may be injected into the organic emission layer OL from the first electrode E1 and the second electrode E2. In this manner, when exitons (e.g., combinations of the holes and the electrons injected into the organic emission layer OL) enter a ground state from an exited state, the organic emission layer OL may emit light. Further, at least one of the first electrode E1 and the second electrode E2 may be formed of a transparent or semi-transparent conductive material, such as, for example, aluminum zinc oxide (AZO), gallium zinc oxide (GZO), indium tin oxide (ITO), indium zinc oxide (IZO), and the like. It is also contemplated that one or more conductive polymers (ICP) may be utilized, such as, for example, polyaniline, poly(3,4-ethylenedioxythiophene) poly(styrenesulfonate) (PEDOT:PSS), etc.

In exemplary embodiments, the organic light emitting diode OLED may emit light in at least one direction with respect to the first substrate 100 and the second substrate 300. As such, the display device 100 including the organic light emitting diode OLED may be configured as a front-side, rear-side, or both-side light emitting organic light emitting diode (OLED) display device 1000.

The sealant 400 may be disposed between the first substrate 100 and the second substrate 300 and may surround the organic light emitting diode OLED of the display 200. To this end, the sealant 400 may be laterally spaced apart from the organic light emitting diode by a determined gap. Further, the sealant 400 may be disposed along edges of the first substrate 100 and the second substrate 300 to enable the first substrate 100 and the second substrate 300 to be assembled and sealed together, e.g., hermetically sealed together. The sealant 400 may include a frit, and may be hardened via any suitable manufacturing technique, e.g., via laser beams, heat treating, etc. As such, the sealant 400 is disposed between the first substrate 100 and the second substrate 300 and seals (e.g., hermitically seals) the organic light emitting diode OLED in a region disposed between the first substrate 100 and the second substrate 300.

According to exemplary embodiments, the interlayer insulation layer ILD may be formed of a low dielectric constant material, such that parasitic capacitance otherwise occurring in association with a portion of the interlayer insulation layer ILD disposed where the gate wire, such as a gate line formed on the same layer as the gate electrode GA crosses the data wire, such as a data line formed on the same layer as the source electrode SE and the drain electrode DE, may be minimized (or otherwise reduced). As such, speed reduction of a signal passing through the various wires of the display device 1000 may be prevented (or otherwise reduced) and display efficiency/quality of an image displayed via the display device 1000 may be improved.

Further, when the display device 1000 includes the interlayer insulation layer ILD formed with a low dielectric constant material having low acid resistance, the clad layer CI including silicon oxide or silicon nitride having high acid resistance may cover the surface of the interlayer insulation layer ILD. In this manner, when the first substrate 100 is cleaned using a cleaning solution, such as hydrogen fluoride, formation of non-uniform grooves on the surface of the interlayer insulation layer ILD may be prevented (or otherwise reduced). As such, the potential for losing a portion of the source electrode SE and/or the drain electrode DE disposed on the surface of the interlayer insulation layer ILD and the data wire including the data line may be prevented (or otherwise reduced).

In addition, when the display device 1000 includes the interlayer insulation layer ILD formed with a low dielectric constant material having low acid resistance, the clad layer CI including a silicon oxide or silicon nitride with high acid resistance may cover the surface of the interlayer insulation layer ILD. This may enable the clad layer CI rather than the interlayer insulation layer ILD to be fused with (or otherwise coupled to) the sealant 400, which may be a frit (e.g., any suitable ceramic composition). In this manner, the sealant 400 may contact the clad layer CI and form a firm bond between the sealant 400 and the clad layer CI when, for example, the sealant 400 is fused to the clad layer CI. That is, since the sealant 400 may be formed with a frit (e.g., glass, ceramic, etc., composition) and the clad layer CI may be formed with an inorganic material, such as silicon nitride, silicon oxide, etc., a relatively strong bond may be formed between the sealant 400 and the clad layer CI based on the affinity between the materials forming the sealant 400 and the clad layer CI. As such, the display device 1000 may exhibit improved impact resistance.

Figure 3:
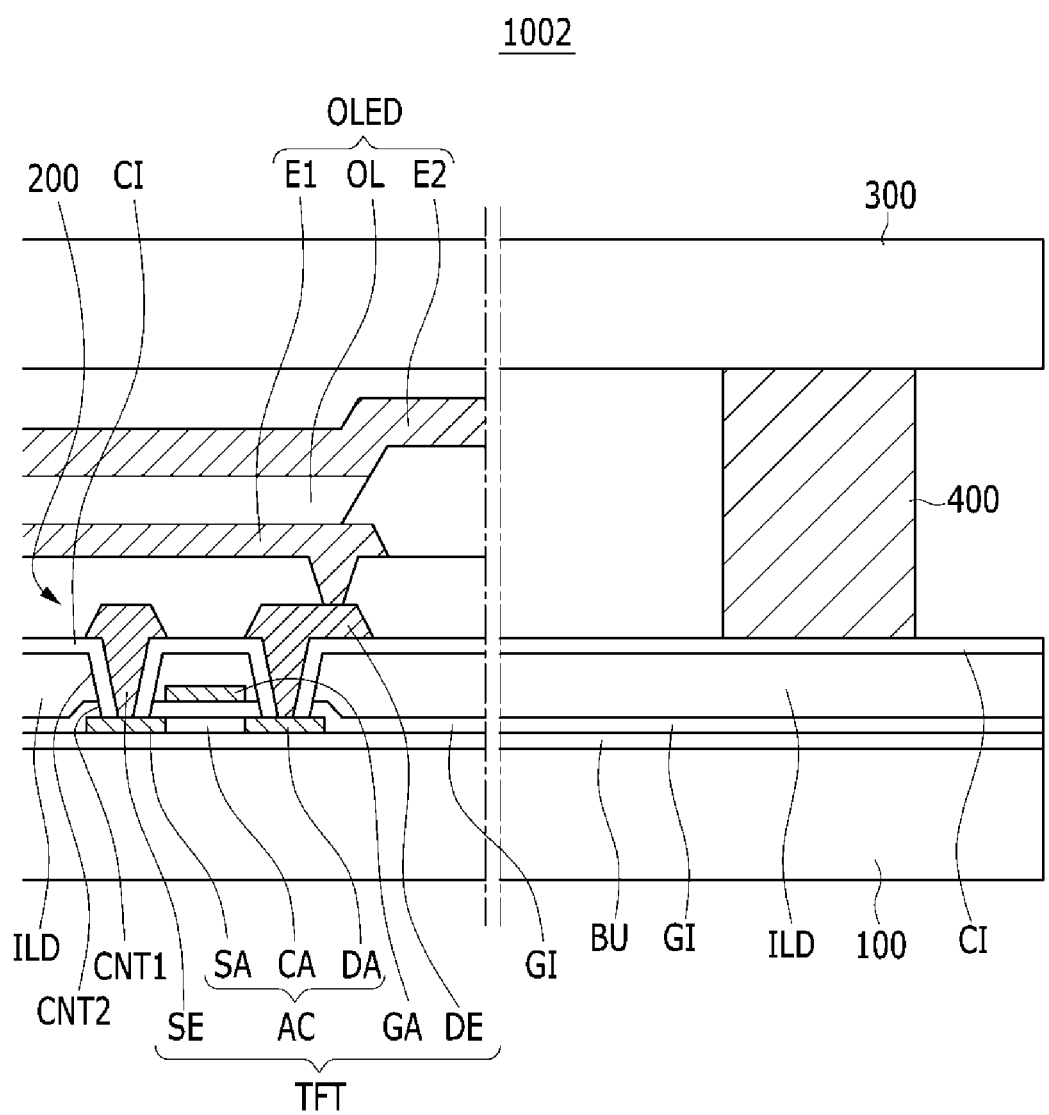
FIG. 3 is a cross-sectional view of a display device, according to exemplary embodiments.

FIG. 3 is a cross-sectional view of a display device, according to exemplary embodiments. It is noted that the display device of FIG. 3 is substantially similar to the display device of FIGS. 1 and 2. As such, primarily differences between the display devices of FIGS. 1-3 are provided below to avoid obscuring exemplary embodiments described herein.

As shown in FIG. 3, the clad layer CI of the display device 1002 may cover a side wall of the interlayer insulation layer ILD corresponding to the second contact hole CNT2 and a side wall of the gate insulation layer GI corresponding to the first contact hole CNT1. In this manner, the clad layer CI may at least partially surround the interlayer insulation layer ILD and the gate insulation layer GI. That is, the entire exposed surface of the interlayer insulation layer ILD may be covered by the gate insulation layer GI and the clad layer CI, sans that portion of the interlayer insulation layer ILD contacting the drain electrode DE and any data line and/or wire coupled to the drain electrode DE. In this manner, the rest of the display device of FIG. 3 may be configured substantially similar to that of the display device of FIGS. 1 and 2.

According to exemplary embodiments, when the display device 1002 includes the interlayer insulation layer ILD formed with a low dielectric constant material having low acid resistance, the clad layer CI and the gate insulation layer GI including a silicon oxide or silicon nitride having high acid resistance may cover substantially the entire surface of the interlayer insulation layer ILD. As such, when the first substrate 100 is cleaned using a cleaning solution, such as hydrogen fluoride, generation of non-uniform grooves on the surface of the interlayer insulation layer ILD may be prevented (or otherwise reduced). In this manner, the potential of losing a portion of the source electrode SE and the drain electrode DE disposed on the surface of the interlayer insulation layer ILD and/or the data wire including the data line may be prevented (or otherwise reduced). In turn, this may further prevent (or otherwise reduce) damage or defects from occurring on the side wall of the interlayer insulation layer ILD corresponding to the second contact hole CNT2.

Figure 4:
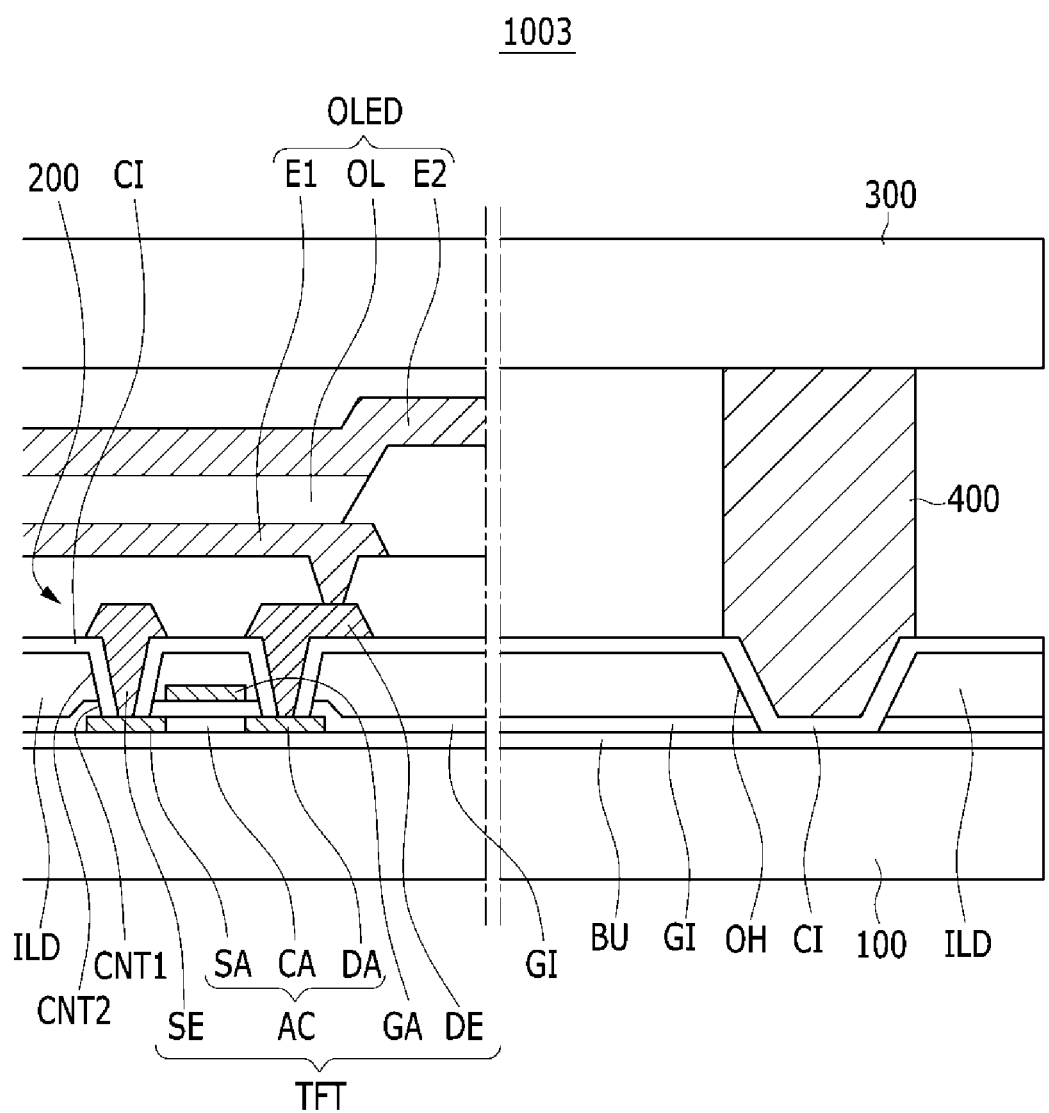
FIG. 4 is a cross-sectional view of a display device, according to exemplary embodiments.

FIG. 4 is a cross-sectional view of a display device, according to exemplary embodiments. It is noted that the display device of FIG. 4 is substantially similar to the display devices of FIG. 3. As such, primarily differences between the display devices of FIGS. 3 and 4 are provided below to avoid obscuring exemplary embodiments described herein.

As shown in FIG. 4, an interlayer insulation layer ILD of the display device 1003 includes an open hole OH exposing a side wall of the gate insulation layer GI and a buffer layer BU. The open hole OH may be disposed in correspondence to the sealant 400. That is, a portion of the sealant 400 may extend into the open hole OH. To this end, the clad layer CI may cover the side wall of the interlayer insulation layer ILD corresponding to the second contact hole CNT2 and the side wall of the gate insulation layer GI corresponding to the first contact hole CNT1. In this manner, the clad layer CI together with the gate insulation layer GI may at least partially surround the interlayer insulation layer ILD. Further, the clad layer CI may cover the side wall of the gate insulation layer GI exposed by the open hole OH, and, as such, the clad layer CI may contact the gate insulation layer GI and cover the side wall of the interlayer insulation layer ILD corresponding to the open hole OH. In this manner, the clad layer CI and the gate insulation layer GI may surround the interlayer insulation layer ILD. That is, the entire exposed surface of the interlayer insulation layer ILD may be covered by the gate insulation layer GI and the clad layer CI, sans that portion of the interlayer insulation layer ILD contacting the drain electrode DE and any data line and/or wire coupled to the drain electrode DE.

In exemplary embodiments, the sealant 400 may be at least partially disposed inside the open hole OH, and may contact the clad layer CI. To this end, an amount of bonding surface area between the clad layer CI and the sealant 400 may be increased.

According to exemplary embodiments, when the display device 1003 includes the interlayer insulation layer ILD formed with a low dielectric constant material having low acid resistance, the clad layer CI and the gate insulation layer GI including a silicon oxide or silicon nitride having high acid resistance may cover substantially the entire surface of the interlayer insulation layer ILD. As such, when the first substrate 100 is cleaned using a cleaning solution, such as hydrogen fluoride, generation of non-uniform grooves on the surface of the interlayer insulation layer ILD may be prevented (or otherwise reduced). In this manner, the potential of losing a portion of the source electrode SE and the drain electrode DE disposed on the surface of the interlayer insulation layer ILD and/or the data wire including the data line may be prevented (or otherwise reduced). In turn, this may further prevent (or otherwise reduce) damage or defects from occurring on the side walls of the interlayer insulation layer ILD corresponding to the second contact hole CNT2 and the open hole OH.

In addition, when the display device 1003 includes the interlayer insulation layer ILD formed with a low dielectric constant material having low acid resistance, the clad layer CI including a silicon oxide or silicon nitride with high acid resistance may cover the surface of the interlayer insulation layer ILD. This may enable the clad layer CI rather than the interlayer insulation layer ILD to be fused with (or otherwise coupled to) the sealant 400, which may be a frit. In this manner, the sealant 400 may contact the clad layer CI and form a relatively strong bond between the sealant 400 and the clad layer CI. In this manner, the sealant 400 may contact the clad layer CI and form a firm bond between the sealant 400 and the clad layer CI when, for example, the sealant 400 is fused to the clad layer CI. That is, since the sealant 400 may be formed with a frit (e.g., glass, ceramic, etc., composition) and the clad layer CI may be formed with an inorganic material, such as silicon nitride, silicon oxide, etc., a relatively strong bond between the sealant 400 and the clad layer CI may be formed based on the affinity between the materials forming the sealant 400 and the clad layer CI. As such, the display device 1003 may exhibit improved impact resistance.

Further, as seen in FIG. 4, the sealant 400 may be at least partially disposed inside the open hole OH formed in the interlayer insulation layer ILD. To this end, a surface area of the sealant 400 contacting the clad layer CI may increase to form a larger amount of surface area bonded between the sealant 400 and the clad layer CI. As such, impact resistance of the display device 1003 may be further improved.

According to exemplary embodiments, the display devices 1000, 1002, and 1003 may be manufactured utilizing any suitable techniques and/or processes. A general process is described below.

The buffer layer BU may be formed on the first substrate 100. An active layer AC including the source area SA, the channel area CA, and the drain area DA may be formed on the buffer layer BU. The gate insulation layer GI may be formed on the buffer layer BU. In exemplary embodiments, the gate insulation layer GI covers the active layer AC. In this manner, a gate electrode GA may be formed on the gate insulation layer GI. Further, the interlayer insulation layer ILD may be formed on the gate insulation layer GI. As such, the interlayer insulation layer ILD may cover the gate electrode GA.

When forming the display device 1000, the clad layer CI may be formed on the interlayer insulation layer ILD. In this manner, one or more patterning processes may be performed to form the contact hole through the clad layer, the first contact hole CNT1 through the interlayer insulation layer ILD, and the second contact hole CNT2 through the gate insulation layer GI. When forming the display devices 1002 and 1003, however, the first contact hole CNT1 and the second contact hole CNT2 may be formed before forming the clad layer CI. As such, when the clad layer CI is formed, the clad layer CI may at least cover respective side walls of the first contact hole CNT1 and the second contact hole CNT2. In association with the display device 1003, the open hole OH may be formed in the interlayer insulation layer ILD and the gate insulation layer GI before, after, or simultaneous with the formation of the first contact hole CNT1 and the second contact hole CNT2. In this manner, formation of the clad layer CI may enable the clad layer CI to at least cover a side wall of the open hole OH.

According to exemplary embodiments, a source electrode SE and a drain electrode DE may be formed on the clad layer CI and may each extend into the first contact hole CNT1 and the second contact hole CNT2. In this manner, the source electrode SE may contact the source area SA of the active layer AC and the drain electrode DE may contact the drain area DA of the active layer.

In exemplary embodiments, another layer (e.g., a passivation layer) may be formed on the clad layer CI in association with a display area of the display devices 1000, 1002, and 1003. In this manner, the other layer may at least cover the source electrode SE and the drain electrode DE, as well as be formed on at least a portion of the clad layer CI. To this end, the other layer may be patterned to form a contact hole exposing at least a portion of the drain electrode DE. Further, a light emitting component (e.g., an organic light emitting diode OLED) may be formed on the other layer. The light emitting component may be formed including a first electrode E1 extending into the hole in the other layer, a second electrode E2 disposed on the first electrode E1, and an organic emission layer OL between the first electrode E1 and the second electrode E2.

One or more additional layers may be formed on the light emitting component (e.g., the organic light emitting diode OLED)). To this end, the sealant 400 may be formed in a non-display area (e.g., peripheral area) of the substrate 100, and, thereby, formed on the clad layer CI. In association with display device 1003, the sealant 400 may be further disposed in association with the open hole OH, such that at least a portion of the sealant 400 extends in the open hole OH. A second substrate 300 may be disposed on the first substrate 100 with the sealant 400 disposed therebetween. In this manner, one or more processes may be performed to bond (or otherwise couple) the second substrate 300 to the first substrate 100 via the sealant 400. For instance, the sealant 400 may be heat treated, laser irradiated, and/or the like, to fuse the sealant 400 to the second substrate 300 and the clad layer CI disposed on the first substrate 100. Although not illustrated, one or more layers may be formed on the second substrate 300 to facilitate adhesion (e.g., fusion) of the sealant 400 therewith. In this manner, the sealant 400 may seal (e.g., hermetically seal) the light emitting component (e.g., the organic light emitting diode (OLED)) in a region between the first substrate 100 and the second substrate 300.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display device, comprising:
   a substrate;
   an active layer disposed on the substrate;
   a gate insulation layer disposed on the active layer;
   a gate electrode disposed on the gate insulation layer;
   an interlayer insulation layer disposed on the gate electrode, a dielectric constant of the interlayer insulation layer being less than a dielectric constant of the gate insulation layer;
   a contact hole formed through the interlayer insulation layer and the gate insulation layer;
   a clad layer disposed on the interlayer insulation layer, the clad layer covering sidewalls of the interlayer insulation layer and the gate insulating layer corresponding to the contact hole;
   a source electrode disposed on the clad layer; and
   a drain electrode disposed on the clad layer.

2. The display device of claim 1, wherein the contact hole exposes a portion of the active layer.

3. The display device of claim 2, wherein the source electrode or the drain electrode is connected to the active layer through the contact hole.

4. The display device of claim 1, further comprising:
   an organic light emitting diode connected to the drain electrode;
   another substrate disposed on the substrate, the organic light emitting diode being disposed between the substrate and the other substrate; and a sealant disposed between the substrate and the other substrate, the sealant enclosing the organic light emitting diode in a region disposed between the substrate and the other substrate.

5. The display device of claim 4, wherein:

the interlayer insulation layer further comprises a hole exposing the gate insulation layer, the hole being disposed in association with the sealant; and the clad layer contacts the gate insulation layer exposed by the hole and covers a sidewall of the interlayer insulation layer corresponding to the hole.

6. The display device of claim 5, wherein:

the hole extends into at least a portion of the gate insulation layer; and the clad layer covers a sidewall of the gate insulation layer corresponding to the hole.

7. The display device of claim 5, wherein the sealant is at least partially disposed in the hole and disposed on the clad layer.

8. The display device of claim 7, wherein the sealant comprises a frit.

9. The display device of claim 1, wherein the gate insulation layer comprises at least one of silicon oxide and silicon nitride.

10. The display device of claim 1, wherein the clad layer comprises at least one of silicon oxide and silicon nitride.

11. The display device of claim 1, wherein the dielectric constant of the interlayer insulation layer is 2.5 to 3.5.

12. The display device of claim 11, wherein the interlayer insulation layer comprises at least one of silicon oxycarbide and silicon oxyfluoride.

13. A display device, comprising:

a first substrate;

an active layer disposed on the first substrate;

a first insulation layer disposed on the active layer;

a second insulation layer disposed on the first insulation layer, the second insulation layer comprising a hole exposing a portion of the first insulation layer;

a clad layer disposed on the first and second insulation layers, the clad layer covering a sidewall of the hole;

an organic light emitting diode electrically connected to a portion of the active layer;

a sealant at least partially disposed in the hole; and a second substrate coupled to the first substrate via the sealant, the sealant enclosing the organic light emitting diode in a region disposed between the first and second substrates.

* * * * *